United States Patent [19]

Clatanoff et al.

[11] Patent Number: 5,673,795
[45] Date of Patent: Oct. 7, 1997

[54] DISCRETE PACKAGING SYSTEM FOR ELECTRONIC DEVICE

[75] Inventors: William J. Clatanoff, Austin; Warren Allen Fink, Leander, both of Tex.

[73] Assignee: Minnesota Mining and Manufacturing Company, St. Paul, Minn.

[21] Appl. No.: 494,970

[22] Filed: Jun. 26, 1995

[51] Int. Cl.[6] .................. B65D 73/02; B65D 85/42; H01L 23/04

[52] U.S. Cl. .................. 206/719; 206/722; 206/724; 206/725; 174/52.4

[58] Field of Search .................. 206/709, 719, 206/722, 725, 724; 174/52.1, 52.4; 257/723, 725, 729; 248/636, 638, 674, 680, 681, 565, 575, 576

[56] References Cited

U.S. PATENT DOCUMENTS

| | | |
|---|---|---|
| 4,241,829 | 12/1980 | Hardy .................. 206/709 |
| 4,564,880 | 1/1986 | Christ et al. .................. 361/212 |
| 4,591,053 | 5/1986 | Alemanni et al. .................. 206/331 |
| 4,654,693 | 3/1987 | Funakoshi et al. .................. 357/74 |
| 4,966,281 | 10/1990 | Kawanishi et al. .................. 206/330 |
| 5,232,091 | 8/1993 | Hennessy .................. 206/331 |
| 5,526,936 | 6/1996 | Matsuzoe .................. 206/724 |

*Primary Examiner*—Kristine L. Kincaid
*Assistant Examiner*—Hung V. Ngo
*Attorney, Agent, or Firm*—Gary L. Griswold; Walter N. Kirn; Matthew B. McNutt

[57] ABSTRACT

A packaging system includes a bottom having a flat surface for accepting an object, a top having a flat surface and projecting fingers extending from the surface of the top. When the top is assembled to the bottom, the fingers deform, forcing the object against the bottom surface. The object is maintained in position by friction against the bottom surface and the presence of undeformed fingers surrounding the object. The packaging system may be made of static dissipative material and include connection claws and rods for connecting a number of packages in series.

4 Claims, 2 Drawing Sheets

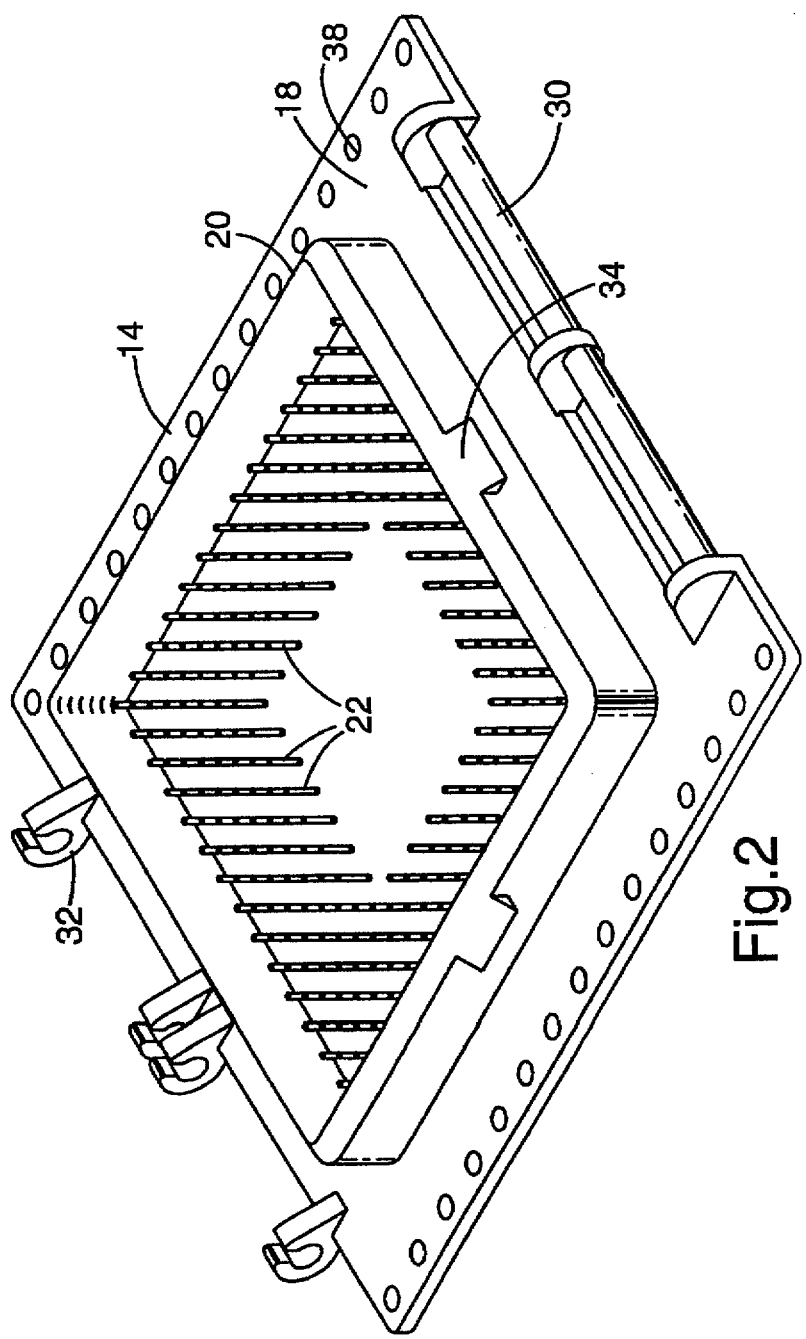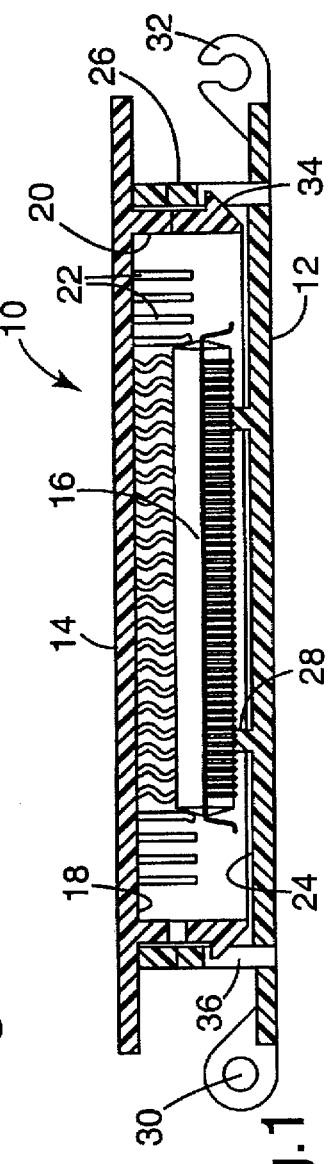

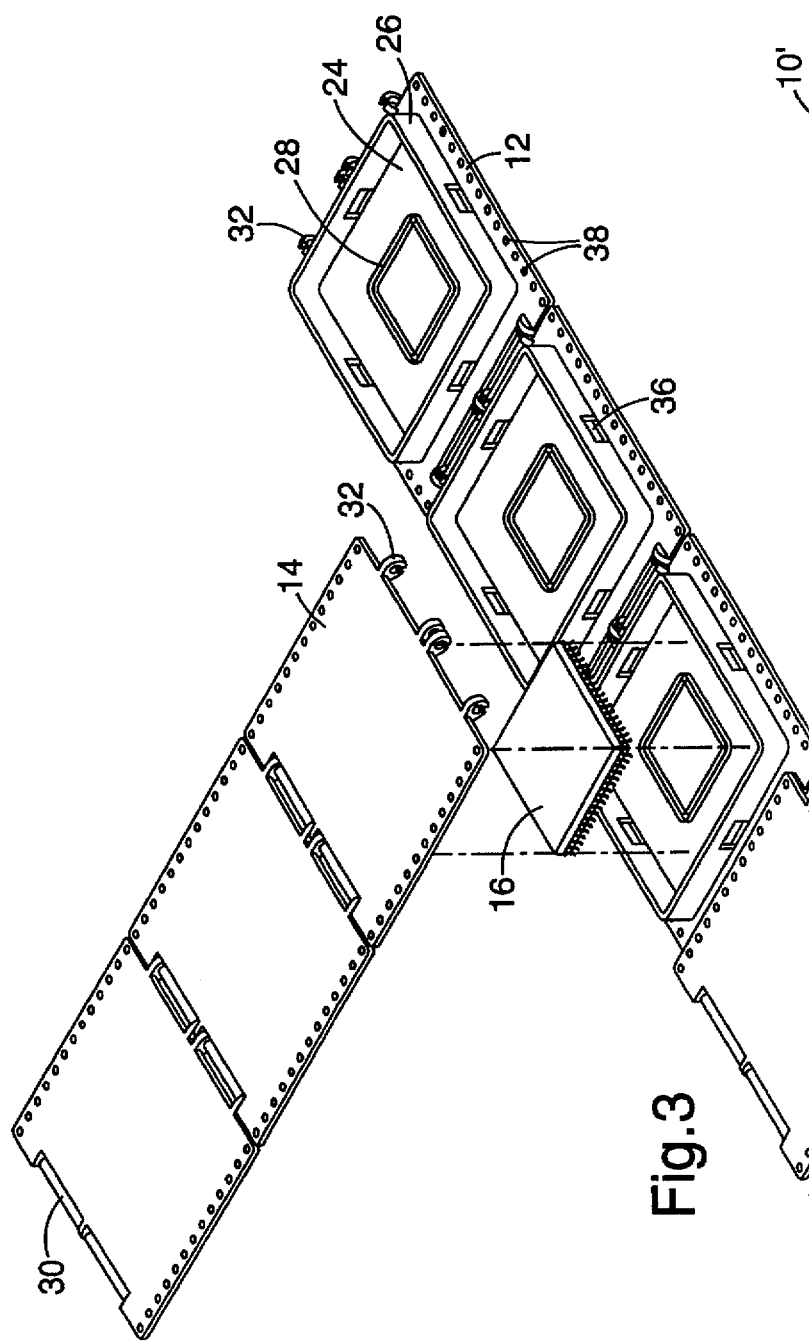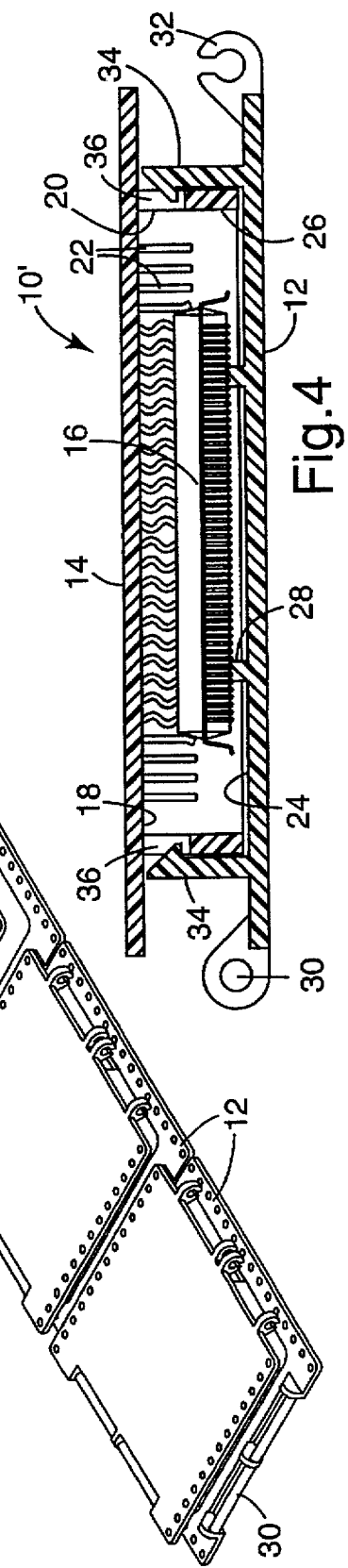

DISCRETE PACKAGING SYSTEM FOR ELECTRONIC DEVICE

FIELD OF THE INVENTION

This inventions relates generally to packaging for electronic devices and, more particularly, to packaging which is separable into individual packaging elements to protect a single device.

BACKGROUND OF THE INVENTION

Electronic devices such as integrated circuits which include a body encapsulating the circuitry and a large number of delicate leads extending from the body, cannot withstand very much handling without being damaged. To avoid such damage it would be desirable to package such devices in packaging from which the device which need not be removed as the device goes through the chain of commerce from the manufacturer to the end user. Most packaging, however, requires that the devices be repackaged if it is desired to send on less than the number of units sent from the prior source. This requires handling and exposes the device to possible damage.

A packaging system which would allow the packaging itself to be separated into smaller lots without opening the package would prevent much waste due to damaged goods. Of course, such a system must be able to adequately protect the device from shock, environmental contaminants and static electricity in addition to providing convenience in reshipping.

SUMMARY OF THE INVENTION

The present invention addresses the issues above by providing a series of individual packages for electronic devices which may be connected to each other in any number and subsequently separated for reshipment if required. In particular, the invention is a packaging assembly for substantially flat objects comprising a package bottom having a substantially flat surface for receiving the object; a package top having a flat surface and an array of long, thin, flexible projections extending from the flat surface, the projections being resiliently deformable upon contact with the object; means for retaining the package bottom in contact with the package top with the package top flat surface and the package bottom flat surface substantially parallel, so that the object is retained in position on the package bottom flat surface by pressure of deformed projections and the presence of undeformed projections adjacent the object. In addition, the packaging assembly may include means such as rods on one end and resilient claws on the other to allow a number of assemblies to be connected together. The assembly may be made of static electricity dissipative material to further protect the object.

BRIEF DESCRIPTION OF THE DRAWINGS

The present invention will be described with respect to the accompanying drawings, wherein like numbers refer to like parts in the several views, and wherein:

FIG. 1 is a cross-sectional view of a packaging assembly according to the present invention;

FIG. 2 is a perspective view of one half of the packaging assembly of FIG. 1; and FIG. 3 is a perspective view of a number of packaging assemblies of FIG. 1 as they may be used in a manufacturing environment.

FIG. 4 is a cross-sectional view of an alternative embodiment of the packaging assembly of FIG. 1.

DESCRIPTION OF THE PREFERRED EMBODIMENT

With reference to the Figures, the invention is a packaging assembly 10 which includes a package bottom 12 and a package top 14. The packaging assembly 10 is intended to enclose and protect an object 16, particularly an electronic device such as an integrated circuit. These devices 16 are typically uniform in circumferential shape, such as square or rectangular, and have a uniform thickness. However, the packaging assembly 10 of the invention may be used with many differently shaped electronic devices or, more generally, objects which are not electronic in nature or uniform in shape. As examples, the object may have any circumferential shape and may have an irregular, concave or convex cross-section.

The package top 14 includes a flat surface 18, upstanding walls 20 and resilient, projecting fingers 22. The package bottom 12 includes a flat surface 24 for receiving the device 16 and upstanding walls 26 sized to engage the package top 14 walls 20. The package bottom 12 may include a pedestal 28 which is either solid or merely an outline, to support the device 16 above the surface 24 of the package bottom 12.

The package top 14 and package bottom 12 may further include rods 30 at one end and resilient claws 32 at the opposite end to allow a number of tops 14 and/or bottoms 12 to be releasably connected together. The package tops 14 and package bottoms 12 preferably include complimentary means for retaining the two together. The Figures illustrate a hook 34 in the package top 14 for engaging cutouts 36 in the walls 26 of the package bottom 12, although many other means for connecting the two parts will be apparent. For example, hooks 34 may be on package bottom 12 and cutouts 36 in top 14, as shown in FIG. 4. Both the package top 14 and package bottom 12 are molded of polymers such as polyolefins, and preferably polypropylene, although other materials and manufacturing processes may be used.

The fingers 22 of the package top 14 are dimensioned in length to project slightly beyond the top of the device 16 when the package top 14 and package bottom 12 are connected, and dimensioned in thickness to deform yet retain resiliency when contacted by the device 16. The most desirable dimensions will depend upon such things as the material of which the packaging assembly 10 is molded, the force it is desired to exert on the device 16 and the portion of the thickness of the device 16 it is desired to capture. The fingers 22 may cover the entire surface of the package top 14 or only a portion as shown in FIG. 2.

As best seen in FIG. 1, the device 16 is positioned on the pedestal 28 of the package bottom 12 and the package top 14 is positioned over the package bottom 12 and mated until the hooks 34 latch the two together. In the process of attaching the package top 14 to the package bottom 12, the fingers 22 are resiliently deformed by contact with the device 16. Fingers 22 just outside the circumference of the device 16 are not deformed. The resilient deformation of the fingers 22 create a force which presses the device against the package bottom 12. Friction thus assists in preventing shifting of the device 16 within the packaging assembly 10. The undeformed fingers 22 surrounding the device 16 also aid in preventing shifting of the device 16.

FIG. 3 illustrates how the packaging assembly 10 might be used in a production setting. A number of package tops 14 and package bottoms 12 are provided in a connected strips and may be, for example, wound on reels (not shown). As the package bottoms 12 pass, driven by sprocket holes 38, a device 16 is inserted and a package top 14 is pressed from above onto the package bottom 12. Downward movement of one package top 14 relative to those remaining in the strip causes the hooks 32 to release from the rods 30 and thus the package top 14 to separate from the strip. It is desirable that the connecting hooks 34 and rods 30 of the package top 14 and package bottom 12 face in different directions as they are assembled so that the packaging assemblies 10 are connected by only one set of hooks 32 and rods 30. Thus the two strips of package tops 14 and package bottoms 12 are shown approaching at a right angle. The result is a connected strip of assembled packaging assembly 10 wherein the package bottoms 12 are connected but the package tops 14 are not. Of course, the opposite could be true. These packaging assemblies 10 may be shipped in a continuous strip of any length or manually or automatically separated into any number.

Thus there has been described a packaging system which adequately protects an electronic device from damage and which may be used for bulk transport or singularized shipment. Although the invention has been described with respect to only a single embodiment, many modifications will be apparent to those skilled in the art. For example, the packaging assembly 10 may assume shapes other than the square shown. Other latching mechanisms may be used to retain the package top 14 and package bottom 12 in engagement, and other means may be used to connect a number of assemblies together.

The invention claimed is:

1. A packaging assembly for substantially flat objects comprising:

a package bottom having a substantially flat surface for receiving an object;

a package top having a flat surface and an array of long thin flexible projections extending from said flat surface, said projections being resiliently deformable upon contact with the object;

means for retaining said package bottom in contact with said package top with said package top flat surface and said package bottom flat surface substantially parallel;

so that the object is retained in position on said package bottom flat surface by pressure of deformed projections and the presence of undeformed projections adjacent the object; and means for connecting additional package bottoms to said package bottom to produce a connected series of package bottoms.

2. A packaging assembly according to claim 1 wherein said means for connecting includes a plurality of claws disposed on one edge of said package bottom and rods disposed on an edge of said package bottom opposite said one edge.

3. A packaging assembly for substantially flat objects comprising:

a package bottom having a substantially flat surface for receiving an object;

a package top having a flat surface and an array of long thin flexible projections extending from said flat surface, said projections being resiliently deformable upon contact with the object;

means for retaining said package bottom in contact with said package top with said package top flat surface and said package bottom flat surface substantially parallel;

so that the object is retained in position on said package bottom flat surface by pressure of deformed projections and the presence of undeformed projections adjacent the object; and means for connecting additional package tops to said package top to produce a connected series of package tops.

4. A packaging assembly according to claim 3 wherein said means for connecting includes a plurality of claws disposed on one edge of said package top and rods disposed on an edge of said package top opposite said one edge.

* * * * *